United States Patent
Chi et al.

(10) Patent No.: US 8,314,486 B2
(45) Date of Patent: Nov. 20, 2012

(54) INTEGRATED CIRCUIT PACKAGING SYSTEM WITH SHIELD AND METHOD OF MANUFACTURE THEREOF

(75) Inventors: HeeJo Chi, Ichon-si (KR); NamJu Cho, Uiwang-si (KR); HyungSang Park, Hanam-si (KR)

(73) Assignee: STATS ChipPAC Ltd., Singapore (SG)

( * ) Notice: Subject to any disclaimer, the term of this patent is extended or adjusted under 35 U.S.C. 154(b) by 71 days.

(21) Appl. No.: 12/711,250

(22) Filed: Feb. 23, 2010

(65) Prior Publication Data

US 2011/0204494 A1 Aug. 25, 2011

(51) Int. Cl.
*H01L 23/10* (2006.01)

(52) U.S. Cl. . 257/710; 257/704; 257/924; 257/E23.128; 257/E21.5; 257/E21.501

(58) Field of Classification Search .................. 257/704, 257/710, 924, E23.128, E23.18–E23.193, 257/E21.5, E21.501
See application file for complete search history.

(56) References Cited

U.S. PATENT DOCUMENTS

| | | | |
|---|---|---|---|
| 6,509,636 B1* | 1/2003 | Tsai et al. | 257/678 |
| 6,933,598 B2 | 8/2005 | Karnezos | |
| 7,196,427 B2 | 3/2007 | Mangrum | |
| 7,217,993 B2 | 5/2007 | Nishimura | |
| 7,579,672 B2 | 8/2009 | Wu | |
| 2005/0212078 A1* | 9/2005 | Kwon et al. | 257/516 |
| 2006/0189033 A1* | 8/2006 | Kim | 438/109 |
| 2007/0141751 A1* | 6/2007 | Mistry et al. | 438/109 |
| 2009/0321898 A1 | 12/2009 | Pagaila et al. | |
| 2010/0013065 A1 | 1/2010 | Mistry et al. | |

OTHER PUBLICATIONS

U.S. Appl. No. 12/434,367, filed May 1, 2009, Chi et al.

* cited by examiner

*Primary Examiner* — Marcos D. Pizarro
*Assistant Examiner* — Bilkis Jahan
(74) *Attorney, Agent, or Firm* — Ishimaru & Associates LLP; Mikio Ishimaru; Stanley M. Chang

(57) ABSTRACT

A method of manufacture of an integrated circuit packaging system includes: providing a base substrate having a component side; mounting a device over the component side; forming a shield connector on the component side adjacent the device; forming a package interconnect on the component side outside a region having the shield connector and the device; applying an encapsulant around the package interconnect, the shield connector, and the device; and mounting a shield structure on the encapsulant, the shield connector, and the device, with the package interconnect partially exposed.

20 Claims, 5 Drawing Sheets

INTEGRATED CIRCUIT PACKAGING SYSTEM WITH SHIELD AND METHOD OF MANUFACTURE THEREOF

TECHNICAL FIELD

The present invention relates generally to an integrated circuit packaging system, and more particularly to a package system with a shield.

BACKGROUND ART

Electronic products such as cell phone base products, global positioning systems (GPS), satellites, communication equipment, consumer products, and a vast line of other similar products are in ever increasing global demand. Market growth for high density and high output/input integrated circuit packages has resulted in a trend for electronic products that are lightweight, smaller in size, multi-functional, and with ever increasing higher speeds.

It is very important for products to continue to improve in features, performance, and reliability while reducing product costs, product size, and equally important to be available quickly for purchase by the consumers or buyers. Products must compete in world markets and attract many consumers or buyers in order to be successful.

Therefore, there is an important need for smaller packages with more circuits, features, and higher performance. The smaller packages need to be able to withstand higher temperatures and less interference from noises in order to deliver the higher performance. As the smaller packages with more circuits continue to get shrink in size, there is a greater need to produce the smaller packages with the ability to provide the higher performance, improved reliability, lower cost, and reduced operating temperatures.

Thus, an increasing need remains to increase the electrical connections of packages as the sizes of the packages continue to shrink in size while the circuits inside those packages continue to increase. The smaller packages and their electrical connections must be able to be connected to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate having a component side; mounting a device over the component side; forming a shield connector on the component side adjacent the device; forming a package interconnect on the component side outside a region having the shield connector and the device; applying an encapsulant around the package interconnect, the shield connector, and the device; and mounting a shield structure on the encapsulant, the shield connector, and the device, with the package interconnect partially exposed.

The present invention provides an integrated circuit packaging system including: a base substrate having a component side; a device mounted over the component side; a shield connector formed on the component side adjacent the device; a package interconnect on the component side outside a region having the shield connector and the device; an encapsulant around the package interconnect, the shield connector, and the device; and a shield structure on the encapsulant, the shield connector, and the device, with the package interconnect partially exposed.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
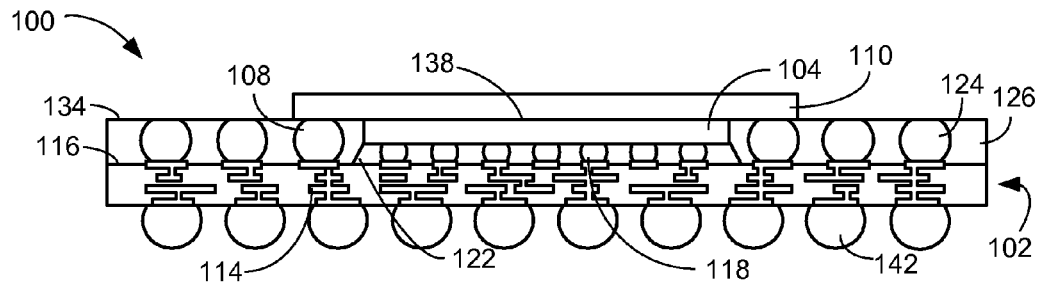
FIG. 1 is a cross-sectional view of an integrated circuit packaging system taken along a line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
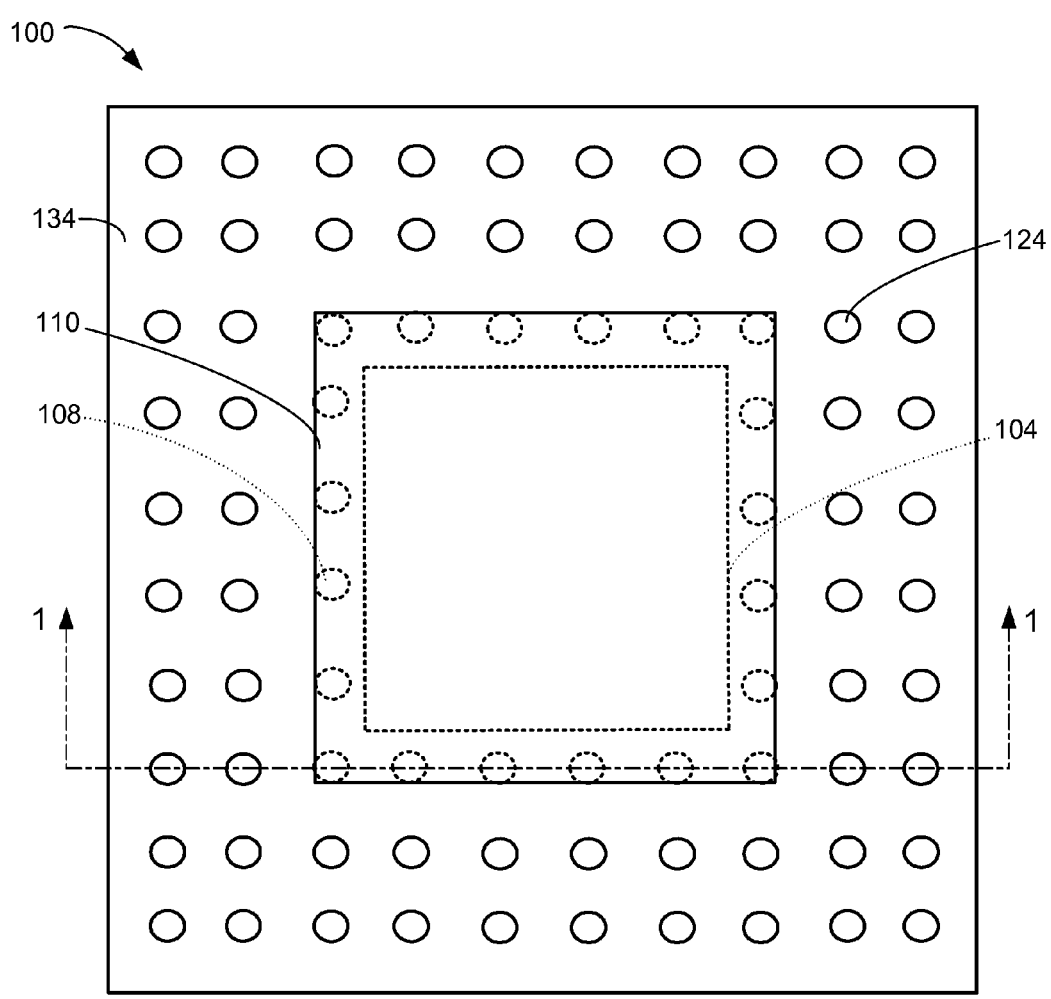
FIG. 2 is a top view of the integrated circuit packaging system of FIG. 1.

Referring now to FIG. 1, therein is shown a cross-sectional view of an integrated circuit packaging system 100 taken along a line 1-1 of FIG. 2 in a first embodiment of the present invention. The integrated circuit packaging system 100 can preferably include a base substrate 102, a device 104, shield connectors 108, and a shield structure 110.

The base substrate 102, such as such as a printed circuit board, a substrate, or a circuit board, can include base conductors 114 exposed on a component side 116 of the base substrate 102 and a side of the base substrate 102 opposite the component side 116. The base conductors 114 can be formed using materials that are electrically conductive and provide connectivity between sides of the base substrate 102.

The device 104, such as a flip chip, a wire bond chip, or a die, can be mounted over and connected to the base conductors 114 exposed on the component side 116 using device connectors 118. An active side of the device 104 can face the component side 116. An underfill 122 can optionally surround the device connectors 118 such as solder, leads, or pins.

The shield connectors 108 can be formed using a material capable of conducting or absorbing electromagnetic energy or heat. The shield connectors 108 can be formed having a cross-sectional shape of a ball, an ellipse, a column, or any cross-sectional geometrical shape. The shield connectors 108 can be formed on the component side 116 along a perimeter of or a region having the device 104.

The shield connectors 108 can be electrically connected on to at least one of the base conductors 114 exposed on the component side 116 to provide a low impedance path or a thermal path with the base substrate 102. The base conductors 114 directly connected to the shield connectors 108 can preferably be attached to an electrical ground, such as an earth ground, a local ground, or a power supply ground.

Package interconnects 124, such as solder, conductive pins, conductive pads, can be mounted on to the component side 116 surrounding a perimeter area or a region having the device 104 and the shield connectors 108. The package interconnects 124 can be electrically connected to the base conductors 114 exposed on the component side 116.

An encapsulant 126 can surround or cover the device 104, the device connectors 118, the shield connectors 108, and the package interconnects 124. A portion of the device 104, the shield connectors 108 and the package interconnects 124 facing away from the component side 116 can preferably be exposed from the encapsulant 126.

The portion of the package interconnects 124 exposed from the encapsulant 126 can be connected to an external assembly. The external assembly can include a flip chip, a ball grid array package, a wafer level chip scale package, a leaded device, a passive component, a manufacturing test or programming system, or any electronic component.

A surface 134 of the encapsulant 126 in direct physical contact with the portion of the shield connectors 108 and the portion of the package interconnects 124 can be formed to be coplanar with the portion of the shield connectors 108 and the portion of the package interconnects 124 exposed from the encapsulant 126.

For illustrative purposes, a side 138 of the device 104 opposite the active side of the device 104 is shown exposed and coplanar with the surface 134 of the encapsulant 126. The side 138 could have been oriented below a plane having the surface 134 of the encapsulant 126.

The shield structure 110, such as an electromagnetic interference shielding plate, a plate, a package ground plane, a laminate, or a film, can be mounted on the encapsulant 126 and directly connected on to the portion of the shield connectors 108 exposed from the encapsulant 126. The shield structure 110 can be on the side 138 of the device 104. The shield structure 110 can preferably be of any shape, size, or orientation provided the shape, the size, and the orientation covers over a perimeter area of or a region having the device 104 and is within a perimeter area or a region defined by all of the shield connectors 108.

The shield structure 110 can be formed using a material capable of conducting or absorbing electromagnetic energy or heat. The shield structure 110 can shield the device 104 from interference, from emission of interference, or can be used to absorb, dissipate, or distribute heat from the device 104 or the integrated circuit packaging system 100.

The shield structure (110) mounted on the encapsulant (126), the shield connector (108), and the device (104), provides electrical and thermal connectivity. The portion of the package interconnect (124) exposed can be exposed adjacent the shield structure 110.

It has been discovered that the shield structure 110 substantially reduces interference from electromagnetic interference and emission of electromagnetic interference.

It has also been discovered that the shield structure 110 can absorb and spread heat energy from the device 104.

The base conductors 114 directly connecting the shield connectors 108 to system connectors 142 can preferably be placed and routed to have a minimized physical connection path length. The system connectors 142, such as conductive balls, leads, or pins, can be attached to the side opposite the component side 116 to provide connectivity between the integrated circuit packaging system 100 and a next level of integration such as a circuit board, a package, or an electronic assembly.

Referring now to FIG. 2, therein is shown a top view of the integrated circuit packaging system 100 of FIG. 1. Shown are the shield structure 110 and the portion of the package interconnects 124 exposed from the surface 134 of the encapsulant 126 of FIG. 1. The shield connectors 108 and the device 104 are shown as hidden lines below the shield structure 110.

For illustrative purposes, the shield connectors 108 are shown individually surrounding the device 104. Any number of the shield connectors 108 can be formed around the device 104. For example, there can be many of the shield connectors 108 in contact with one another resulting in a ring shaped structure around the device 104.

Figure 3:
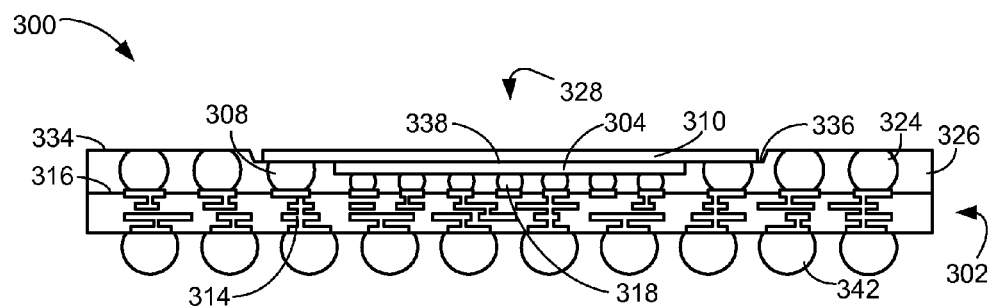
FIG. 3 is a cross-sectional view of an integrated circuit packaging system in a second embodiment of the present invention.

Referring now to FIG. 3, therein is shown a cross-sectional view of an integrated circuit packaging system 300 in a second embodiment of the present invention. The integrated circuit packaging system 300 can preferably include a base substrate 302, a device 304, shield connectors 308, and a shield structure 310.

The base substrate 302 can be identical to the base substrate 102 of FIG. 1. The base substrate 302 includes base conductors 314 and a component side 316 identical to the base conductors 114 of FIG. 1 and the component side 116 of FIG. 1.

The device 304, such as a flip chip, a wire bond chip, or a die, can be mounted over and directly connected to the base conductors 314 exposed on the component side 316 using device connectors 318 such as solder, leads, or pins. An active side of the device 304 can face the component side 316.

The shield connectors 308 can be formed using a material capable of conducting or absorbing electromagnetic energy or heat. The shield connectors 308 can be formed having a cross-sectional shape of a ball, an ellipse, a column, or any cross-sectional geometrical shape.

The shield connectors 308 can be formed on the component side 316 along a perimeter of the device 304. The shield connectors 308 can be connected to the base conductors 314 in a manner identical to the shield connectors 108 of FIG. 1, the component side 116, and the base conductors 114.

The package interconnects 324 can be identical to the package interconnects 124 of FIG. 1. The package interconnects 324 can be mounted and connected to the component side 316 in a manner identical to the package interconnects 124.

An encapsulant 326 can surround the device 304, the device connectors 318, the shield connectors 308, and the package interconnects 324. A portion of the device 304, the shield connectors 308, and the package interconnects 324 facing away from the component side 316 can preferably be exposed from the encapsulant 326. The portion of the package interconnects 324 exposed from the encapsulant 326 can be connected to the external assembly.

A depression 328, such as a crater, a recess, or an indentation, can be formed in the encapsulant 326 over a perimeter area of the device 304 and the shield connectors 308. The depression 328 originates from a first surface 334 of the encapsulant 326 to a second surface 336 of the encapsulant 326 below the first surface 334. The first surface 334 can preferably be parallel with the second surface 336.

The portion of the shield connectors 308 exposed from the encapsulant 326 can be coplanar with the second surface 336. A side 338 of the device 304 opposite the active side of the device 304 can be exposed from and coplanar with the second surface 336. The portion of the package interconnects 324 exposed from the encapsulant 326 can be coplanar with the first surface 334.

The shield structure 310, such as an electromagnetic interference shielding plate, a plate, a package ground plane, a laminate, or a film, can be mounted on the second surface 336 and directly connected on to the portion of the shield connectors 308 exposed from the second surface 336. The shield structure 310 can be on the side 138 of the device 304. The shield structure 310 can preferably be of any shape, size, or orientation provided the shape, the size, and the orientation covers over a perimeter area of the device 304 and is within a perimeter area defined by all of the shield connectors 108.

The shield structure 310 can be formed using a material identical to the material of the shield structure 110 of FIG. 1. The shield structure 310 can shield the device 304 from interference, from emission of interference, or can be used to absorb, dissipate, or distribute heat from the device 304 or the integrated circuit packaging system 300.

System connectors 342 identical to the system connectors 142 of FIG. 1 can be attached to the component side 316 in a manner identical to the system connectors 142. The system connectors 342 can provide connectivity between the integrated circuit packaging system 300 and a next level of integration such as a circuit board, a package, or an electronic assembly.

It has been discovered that the combination of the shield structure 310, the shield connectors 308, and the depression 328 substantially reduces interference from electromagnetic interference or emission of electromagnetic interference for reduced Z-height packaging solutions. The reduced Z-height packaging solutions have a lower profile height when compared with profile heights of packaging solutions implemented without the depression 328.

It has also been discovered that the shield structure 310 and the depression 328 can absorb and spread heat energy from the device 304 or the integrated circuit packaging system 300 for the reduced Z-height packaging solutions.

Figure 4:
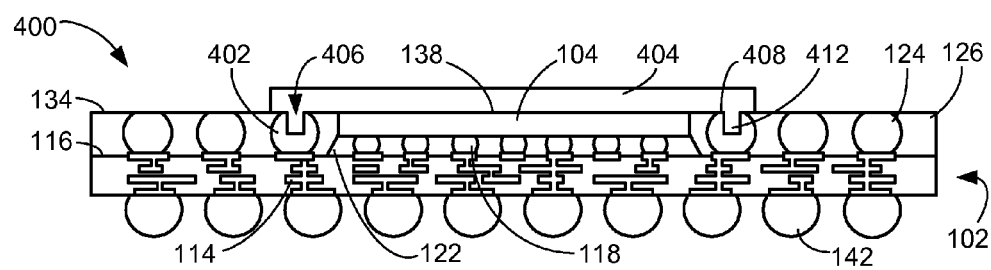
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. The integrated circuit packaging system 400 is shown with the base substrate 102, the base conductors 114, the component side 116, the device connectors 118, the device 104, the underfill 122, the package interconnects 124, the encapsulant 126, the surface 134, the side 138, and the system connectors 142.

The integrated circuit packaging system 400 can preferably be identical to the integrated circuit packaging system 100 of FIG. 1 except for shield connectors 402 and a shield structure 404. The shield connectors 402 can be formed using a material capable of conducting or absorbing electromagnetic energy or heat.

The shield connectors 402 can be formed having cross-sectional shapes of balls, ellipses, columns, or any cross-sectional geometrical shapes. Each of the shield connectors can preferably be formed having an interlock structure 406.

The interlock structure 406, such as a hole, a passage, or a cavity, can be formed from a first end 408 of the shield connectors 402 in to a portion of the shield connectors 402. An end of the shield connectors 402 opposite the first end 408 of the shield connectors 402 can be formed on the component side 116 along a perimeter of the device 104.

The shield connectors 402 can be electrically connected on to at least one of the base conductors 114 exposed on the component side 116 to provide a low impedance path or a thermal path with the base substrate 102. The base conductors 114 directly connected to the shield connectors 402 can preferably be attached to an electrical ground, such as an earth ground, a local ground, or a power supply ground.

The base conductors 114 can directly connect the shield connectors 402 to the system connectors 142 exposed on the side of the base substrate 102 opposite the component side 116. The base conductors 114 directly connecting the shield connectors 402 to the system connectors 142 can preferably be placed and routed to have in a minimized physical connection path length.

The package interconnects 124 can be mounted on to the component side 116 of the base substrate 102 and surround a perimeter area having the device 104 and the shield connectors 402. The package interconnects 124 can be electrically connected to the base conductors 114 exposed on the component side 116.

The encapsulant 126 can surround the device 104, the device connectors 118, the shield connectors 402, and the package interconnects 124. The interlock structure 406 at the first end 408 and a portion of the package interconnects 124 facing away from the component side 116 can preferably be exposed from the encapsulant 126. The portion of the package interconnects 124 exposed from the encapsulant 126 can be connected to the external assembly.

The surface 134 of the encapsulant 126 in direct physical contact with the first end 408 and the portion of the package interconnects 124 can be formed to be coplanar with the portion of the shield connectors 402 and the portion of the package interconnects 124 exposed from the encapsulant 126.

The shield structure 404, such as an electromagnetic interference shielding plate, a plate, a package ground plane, a laminate, or a film, can be formed having interlock couplers 412. The interlock couplers 412, such as docking protrusions, posts, pins, or bumps, can preferably be perpendicular to a planar side of the shield structure 404.

The shield structure 404 can be formed using a material capable of conducting or absorbing electromagnetic energy or heat. The shield structure 404 can be mounted on the encapsulant 126. The shield structure 404 can be directly connected on to the first end 408 of the shield connectors 402 exposed from the encapsulant 126.

The interlock couplers 412 of the shield structure 404 can be oriented directly over the interlock structure 406 of the shield connectors 402 and inserted in to the interlock structure 406 of the shield connectors 402. The interlock couplers 412 can provide connectivity between the shield structure 404 and the shield connectors 402. The shield structure 404 can be on the side 138 of the device 104.

The shield structure 404 can preferably be of any shape, size, or orientation provided the shape, the size, and the orientation covers over a perimeter area of the device 104 and is within a perimeter area defined by all of the shield connectors 108. The shield structure 404 can shield the device 104 from interference, from emission of interference, or can be used to absorb, dissipate, or distribute heat from the device 104 or the integrated circuit packaging system 400.

It has discovered that the shield structure 404 with the interlock couplers 412 and the shield connectors 402 with the interlock structure 406 is extremely effective in transferring and spreading heat energy from the integrated circuit packaging system 400.

It has also been discovered that the interlock couplers 412 and the interlock structure 406 provides superior thermo conductive characteristics between the shield structure 404 and the base substrate 102 as well as structural rigidity for the integrated circuit packaging system 400.

Figure 5:
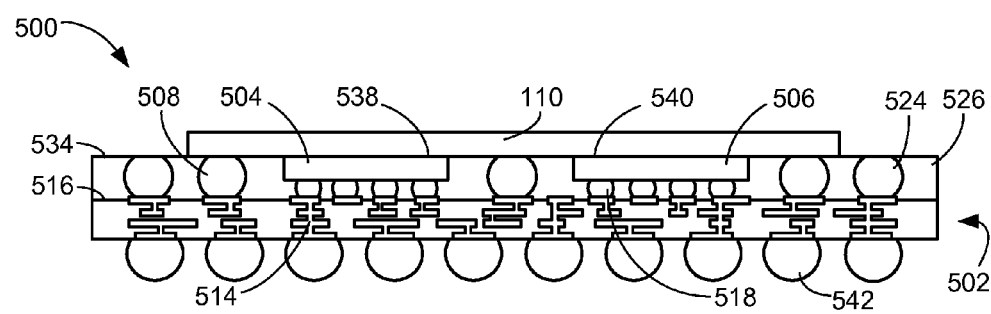
FIG. 5 is a cross-sectional view of an integrated circuit packaging system in a fourth embodiment of the present invention.

Referring now to FIG. 5, therein is shown a cross-sectional view of an integrated circuit packaging system 500 in a fourth embodiment of the present invention. The integrated circuit packaging system 500 can preferably include a base substrate 502, a device 504, an adjacent device 506, shield connectors 508, and a shield structure 510.

The base substrate 502, such as such as a printed circuit board, a substrate, or a circuit board, can include base conductors 514 exposed on a component side 516 of the base substrate 502 and a side of the base substrate 502 opposite the component side 516. The base conductors 514 can be formed using materials that are electrically conductive and provide connectivity between sides of the base substrate 502.

The device 504, such as a flip chip, a wire bond chip, or a die, can be mounted over the component side 516. The device 504 can have an offset away from a plane bisecting the component side 516 and perpendicular to the cross-sectional view.

The adjacent device 506, such as a flip chip, a wire bond chip, or a die, can be mounted over the component side 516. The adjacent device 506 can have an offset away from the device 504 with the plane between the device 504 and the adjacent device 506.

The device 504 and the adjacent device 506 can be connected to the base conductors 514 exposed on the component side 516 using device connectors 518 such as solder, leads, or pins. An active side of the device 504 and an active side of the adjacent device 506 can face the component side 516.

The shield connectors 508 can be formed using a material capable of conducting or absorbing electromagnetic energy or heat. The shield connectors 508 can be formed having a cross-sectional shape of a ball, an ellipse, a column, or any cross-sectional geometrical shape. The shield connectors 508 can be formed on the component side 516 along a perimeter of the device 504 and along a perimeter of the adjacent device 506.

The shield connectors 508 can be electrically connected on to at least one of the base conductors 514 exposed on the component side 516 to provide a low impedance path or a thermal path with the base substrate 502. The base conductors 514 directly connected to the shield connectors 508 can preferably be attached to an electrical ground, such as an earth ground, a local ground, or a power supply ground.

It has been discovered that the shield connectors 508 substantially reduces interference from electromagnetic interference or emission of electromagnetic interference.

It has also been discovered that the shield connectors 508 can absorb and spread heat energy from the base substrate 502.

Package interconnects 524, such as solder, conductive pins, conductive pads, can be mounted on to the component side 516 surrounding a perimeter area having the device 504, the adjacent device 506, and the shield connectors 508. The package interconnects 524 can be electrically connected to the base conductors 514 exposed on the component side 516.

An encapsulant 526 can surround the device 504, the adjacent device 506, the device connectors 518, the shield connectors 508, and the package interconnects 524. A portion of the device 504, the adjacent device 506, the shield connectors 508, and the package interconnects 524 facing away from the component side 516 can preferably be exposed from the encapsulant 526. The portion of the package interconnects 524 exposed from the encapsulant 526 can be connected to the external assembly.

A surface 534 of the encapsulant 526 in direct physical contact with the portion of the shield connectors 508 and the portion of the package interconnects 524 can be formed to be coplanar with the portion of the shield connectors 508 and the portion of the package interconnects 524 exposed from the encapsulant 526.

For illustrative purposes, a side 538 of the device 504 opposite the active side of the device 504 and a side 540 of the adjacent device 506 are shown exposed and coplanar with the surface 534 of the encapsulant 526. The side 538 or the side 540 could be oriented below a plane having the surface 534 of the encapsulant 526.

The shield structure 510, such as an electromagnetic interference shielding plate, a plate, a package ground plane, a laminate, or a film, can be mounted on the encapsulant 526 and directly connected on to the portion of the shield connectors 508 exposed from the encapsulant 526. The shield structure 510 can be on the side 538 of the device 504 or on the side 540 of the adjacent device 506.

The shield structure 510 can preferably be of any shape, size, or orientation provided the shape, the size, and the orientation covers over a perimeter area of the device 504, a perimeter area of the adjacent device 506, and is within a perimeter area defined by all of the shield connectors 508. The shield structure 510 can be formed using a material capable of conducting or absorbing electromagnetic energy or heat.

The base conductors 514 directly connecting the shield connectors 508 to system connectors 542 can preferably be placed and routed to have a minimized physical connection path length. The system connectors 542, such as conductive balls, leads, or pins, can be attached to the side opposite the component side 516 to provide connectivity between the integrated circuit packaging system 500 and a next level of integration such as a circuit board, a package, or an electronic assembly.

It has been discovered that the shield structure 510 substantially reduces interference from electromagnetic interference to the device 504 and the adjacent device 506. It has also been discovered that the shield structure 501 substantially reduces emission of electromagnetic interference from the device 504 and the adjacent device 506.

It has also been discovered that the shield structure 510 can absorb and spread heat energy from the integrated circuit packaging system 500.

Figure 6:
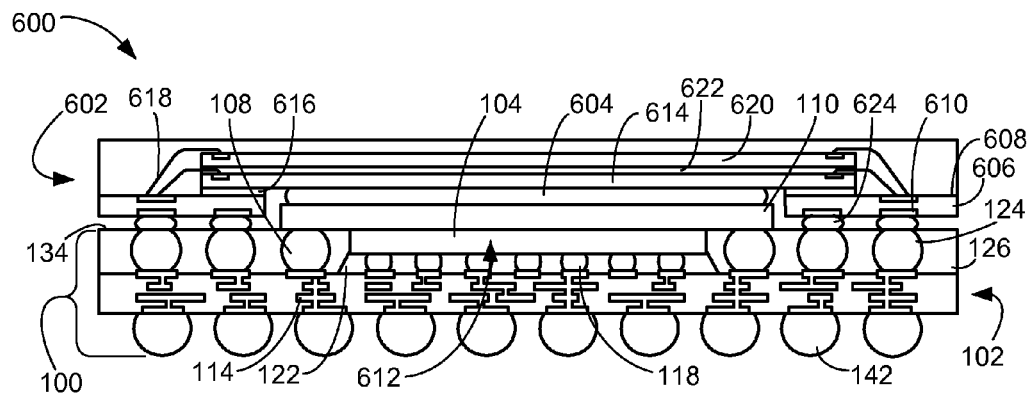
FIG. 6 is a cross-sectional view of an integrated circuit packaging system in a fifth embodiment of the present invention.

Referring now to FIG. 6, therein is shown a cross-sectional view of an integrated circuit packaging system 600 in a fifth embodiment of the present invention. The integrated circuit packaging system 600 can preferably include the integrated circuit packaging system 100, a stack package 602, and a thermal layer 604.

The integrated circuit packaging system 100 is shown including the base substrate 102, the device 104, the shield connectors 108, the shield structure 110, the base conductors 114, the device connectors 118, the package interconnects 124, the encapsulant 126, the surface 134, and the system connectors 142. The stack package 602, such as a package in package, an internal stacked package, or an integrated circuit package, can include a package substrate 606, such as a printed circuit board, a substrate, or a circuit board, having a circuitry side 608 and on a side of the package substrate 606 opposite the circuitry side 608.

The package substrate 606 includes package conductors 610 on the circuitry side 608 and the side of the package substrate 606 opposite the circuitry side. The package conductors 610 are similar to and used in a manner similar to the base conductors 114 exposed on the component side 116 of FIG. 1 and on the side of FIG. 1 of the base substrate 102. The package substrate 606 also includes an opening 612 extending from the circuitry side 608 to the side of the package substrate 606 opposite the circuitry side 608.

A base component 614, such as a wire bond chip, a die, or a module with a width greater than a width of the opening 612, can be mounted over the opening 612 and on to the circuitry side 608 using an adhesive layer 616 such as a glue, film, or a gel. An active side of the base component 614 can face away from the circuitry side 608.

A side of the base component 614 opposite the active side of the base component 614 can be attached on to the shield structure 110 of the integrated circuit packaging system 100 using the thermal layer 604 such as a film, adhesive, glue, or gel. The thermal layer 604 attaching the base component 614 of the stack package 602 with the shield structure 110 of the integrated circuit packaging system 100. The thermal layer 604 can be formed using a material having thermal characteristics capable of absorbing, dissipating, and distributing heat.

A portion of the shield structure 110 can be partially within the opening 612 of the package substrate 606. A remaining portion of the shield structure 110 can be exposed between the package substrate 606 and the surface 134 of the integrated circuit packaging system 100.

The active side of the base component 614 can be electrically connected to the package conductors 610 exposed on the circuitry side 608 using circuit conductors 618. The circuit conductors 618, such as wires, film conductors, leads, or a combination thereof, can each include a horizontal end over the active side of the base component 614.

A stack component 620, similar to the base component 614, can be mounted over the active side of the base component 614 and the horizontal end of the circuit conductors 618 using a stack adhesive 622 similar to the adhesive layer 616. An active side of the stack component 620 can be electrically connected to the package conductors 610 exposed on the circuitry side 608 using the circuit conductors 618 in a similar to the active side of the base component 614 and the package conductors 610 connected to the base component 614.

The circuitry side 608, the package conductors 610, and the stack component 620 can be covered with the encapsulant 126. The package conductors 610 exposed on the side of the package substrate 606 opposite the circuitry side 608 can be directly connected to the package interconnects 124 exposed on the surface 134 using stack connectors 624, such as solder balls, globs, or puddles.

For illustrative purposes, the integrated circuit packaging system 600 is shown with the thermal layer 604 between the stack package 602 and the integrated circuit packaging system 100. The integrated circuit packaging system 600 may optionally be formed without the thermal layer 604. For example, if the stack package 602 has an operating power dissipation that exceeds an operating power dissipation rating of the integrated circuit packaging system 100, omission of the thermal layer 604 can limit thermal transfer coupling between the stack package 602 and the integrated circuit packaging system 100.

It has been discovered that a combination of the shield structure 110 and the thermal layer 604 can improve heat distribution characteristics by provide increased thermal contact area between the integrated circuit packaging system 100 and the stack package 602.

It has also been discovered that the electromagnetic interference blocking characteristics of the shield structure 110 remain intact and are not affected by application of the thermal layer 604.

Figure 7:
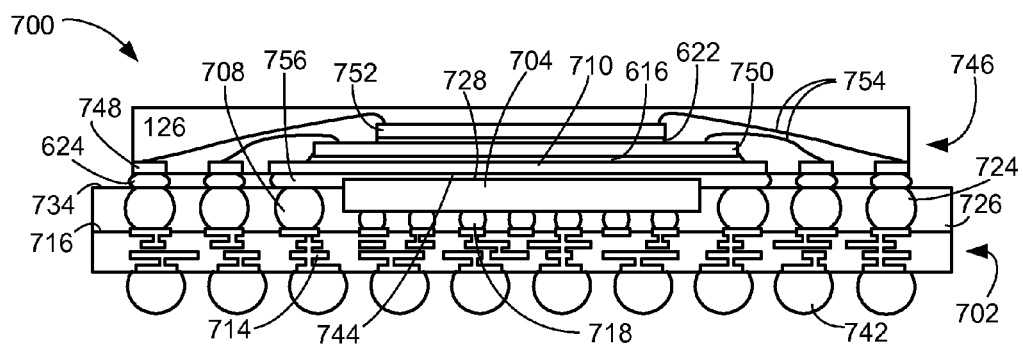
FIG. 7 is a cross-sectional view of an integrated circuit packaging system in a sixth embodiment of the present invention.

Referring now to FIG. 7, therein is shown a cross-sectional view of an integrated circuit packaging system 700 in a sixth embodiment of the present invention.

The integrated circuit packaging system 700 can preferably include a base substrate 702, a device 704, shield connectors 708, and a shield structure 710.

The base substrate 702, such as such as a printed circuit board, a substrate, or a circuit board, can include base conductors 714 exposed on a component side 716 of the base substrate 702 and a side of the base substrate 702 opposite the component side 716. The base conductors 714 can be formed using materials that are electrically conductive and provide connectivity between sides of the base substrate 702.

The device 704, such as a flip chip, a wire bond chip, or a die, can be mounted over and connected to the base conductors 714 exposed on the component side 716 using device connectors 718 such as solder, leads, or pins. An active side of the device 704 can face the component side 716.

The shield connectors 708 can be formed using a material capable of conducting or absorbing electromagnetic energy or heat. The shield connectors 708 can be formed having a cross-sectional shape of a ball, an ellipse, a column, or any cross-sectional geometrical shape. The shield connectors 708 can be mounted on to the component side 716 along a perimeter of the device 704.

The shield connectors 708 can be electrically connected on to at least one of the base conductors 714 exposed on the component side 716 to provide a low impedance path or a thermal path with the base substrate 702. The base conductors 714 directly connected to the shield connectors 708 can preferably be attached to an electrical ground, such as an earth ground, a local ground, or a power supply ground.

Package interconnects 724, such as solder, conductive pins, conductive pads, can be mounted on to the component side 716 surrounding a perimeter area having the device 704 and the shield connectors 708. The package interconnects 724 can be electrically connected to the base conductors 714 exposed on the component side 716. The system connectors 742, such as conductive balls, leads, or pins, can be attached to the side opposite the component side 716.

An encapsulant 726 can surround the device 704, the device connectors 718, the shield connectors 708, and the package interconnects 724. A portion of the device 704, the shield connectors 708, and the package interconnects 724 facing away from the component side 716 can preferably be exposed from the encapsulant 726. A side 728 of the device 704 opposite the active side of the device 704 can preferably be exposed from the encapsulant 726.

A surface 734 of the encapsulant 726 in direct physical contact with the portion of the shield connectors 708 and the portion of the package interconnects 724 can be formed to be coplanar with the portion of the shield connectors 708 and the portion of the package interconnects 724 exposed from the encapsulant 726. The side of the device 704 can be coplanar to the surface 734 or be parallel to and above the surface 734.

The shield structure 710, such as a package ground plane, an electromagnetic interference shielding plate, a plate, a laminate, or a film, can be formed using a material capable of conducting or absorbing electromagnetic energy or heat. The shield structure 710 can include an exposed side 744. The shield structure 710 can be formed or integrated with an integrated circuit component 746 such as a laminate package, a module, or a package.

Conductive contacts 748, such as leads, pads, or contacts, can be located around the shield structure 710. A side of each of the conductive contacts 748 can be coplanar with the exposed side 744 of the shield structure 710.

A first chip 750, such as a wire bond chip, a die, or a module, can be mounted on to a side of the shield structure 710 opposite the exposed side 744 using the adhesive layer 616. An active side of the first chip 750 can face away from the shield structure 710.

A second chip 752, similar to the first chip 750, can be mounted on to the active side of the first chip 750 using the stack adhesive 622. An active side of the second chip 752 can face away from the active side of the first chip 750.

Wires 754 can be used to connect the active side of the first chip 750 or the active side of the second chip 752 to a side of the conductive contacts 748 opposite the side of the conductive contacts 748 coplanar with the exposed side 744.

The first chip 750, the second chip 752, the wires 754, the conductive contacts 748, and the shield structure 710 can be covered with the encapsulant 126 resulting in formation of the integrated circuit component 746. The exposed side 744 and the side of the conductive contacts 748 coplanar with the exposed side 744 are exposed from the encapsulant 126.

The exposed side 744 of the shield structure 710 can be mounted on to the side 728 of the device 704 exposed from the surface 734 using an electrically conductive layer 756, such as a solder, a layer of solder balls, or a solder blob. The shield structure 710 of the integrated circuit component 746 can preferably be mounted over the shield connectors 708 and connected to the device 704 with the electrically conductive layer 756. The side of the conductive contacts 748 coplanar with the exposed side 744 can be directly connected on to the package interconnects 724 exposed on the component side 716 using the stack connectors 624.

The shield structure 710 of the integrated circuit component 746 can shield the device 704 from interference, from emission of interference to the integrated circuit component 746, or can be used to absorb, dissipate, or distribute heat from the device 704 or the integrated circuit component 746.

The base conductors 714 directly connecting the shield connectors 708 to the system connectors 742 can preferably be placed and routed to have a minimized physical connection path length. The system connectors 742 provide connectivity between the integrated circuit packaging system 700 and a next level of integration such as a circuit board, a package, or an electronic assembly.

It has been discovered that the shield structure 710 substantially reduces interference from electromagnetic interference and emission of electromagnetic interference between the integrated circuit component 746 and the device 704.

It has also been discovered that the shield structure 710 can absorb and spread heat energy between the device 704 and the integrated circuit component 746.

Figure 8:
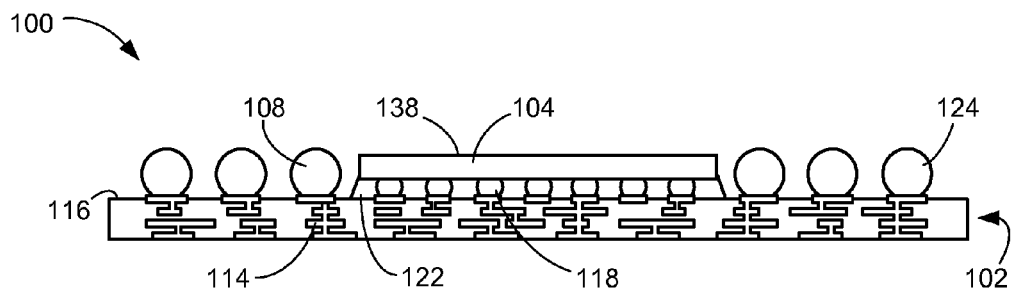
FIG. 8 is the structure of FIG. 1 in a component attachment phase of manufacture.

Referring now to FIG. 8, therein is shown the structure of FIG. 1 in a component attachment phase of manufacture. The device 104, the shield connectors 108, and the package interconnects 124 can be connected to the base conductors 114 exposed on the component side 116 of the base substrate 102.

A connection process, such as an ultrasonic process, a thermo-sonic process, or a combination thereof, can be used to connect the device connectors 118 directly between the base conductors 114 and the device 104 and the base conductors 114 to the shield connectors 108 or the package interconnects 124. The underfill 122 can optionally be applied to the device connectors 118 using a filling process such as injection, molding, or depositing process.

Figure 9:
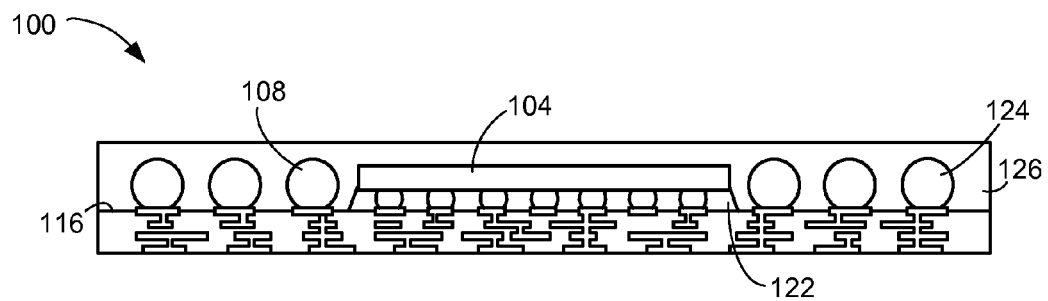
FIG. 9 is the structure of FIG. 8 in an encapsulation phase.

Referring now to FIG. 9, therein is shown the structure of FIG. 8 in an encapsulation phase. The component side 116, the shield connectors 108, the package interconnects 124, and the device 104 can be covered with the encapsulant 126 using an encapsulation process. The encapsulant 126 can surround the shield connectors 108, the package interconnects 124, the underfill 122, and the device 104.

Figure 10:
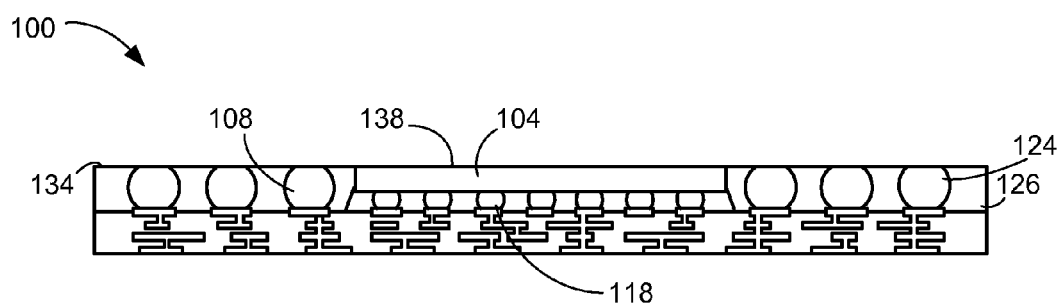
FIG. 10 is the structure of FIG. 9 in a removal phase.

Referring now to FIG. 10, therein is shown the structure of FIG. 9 in a removal phase. A planar portion of the encapsulant 126 over the device 104 is removed using a removal process, such as grinding, shaving, or cutting, to form the surface 134 and to expose the portion of the shield connectors 108, the portion of the package interconnects 124, and the side 138 of the device 104. The portion of the shield connectors 108, the portion of the package interconnects 124, and the side 138 of the device 104 can be coplanar as a result of the removal process.

Figure 11:
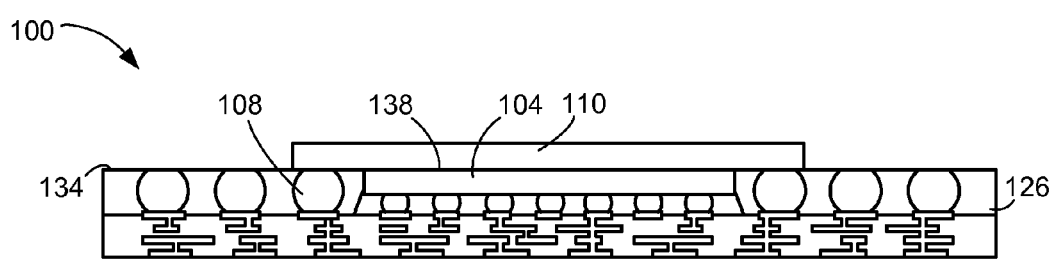
FIG. 11 is a cross-sectional view of FIG. 10 in a structure attachment phase.

Referring now to FIG. 11, therein is shown a cross-sectional view of FIG. 10 in a structure attachment phase. The shield structure 110 is directly connected on the side 138 of the device 104 and attached on to the portion of the shield connectors 108 exposed from the surface 134 of the encapsulant 126 using a connecting process such as thermo-compression, ultrasonic, thermo-sonic, wedge bonding, wire bonding, ball bonding, solder reflowing.

Figure 12:
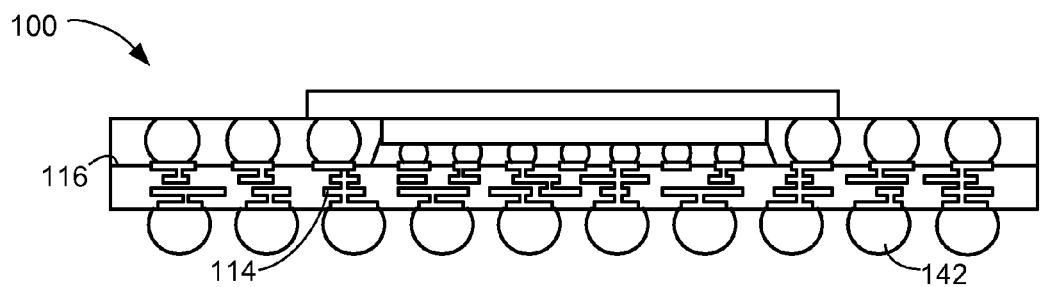
FIG. 12 is a cross-sectional view of FIG. 11 in a connector attachment phase.

Referring now to FIG. 12, therein is shown a cross-sectional view of FIG. 11 in a connector attachment phase. The system connectors 142 can be attached to the base conductors 114 exposed on the side opposite the component side 116 using the connecting process. The integrated circuit packaging system 100 can be singulated for separation, fit, or finish using a planarization process such as grinding, sanding, cutting, sawing, or polishing as needed.

Figure 13:
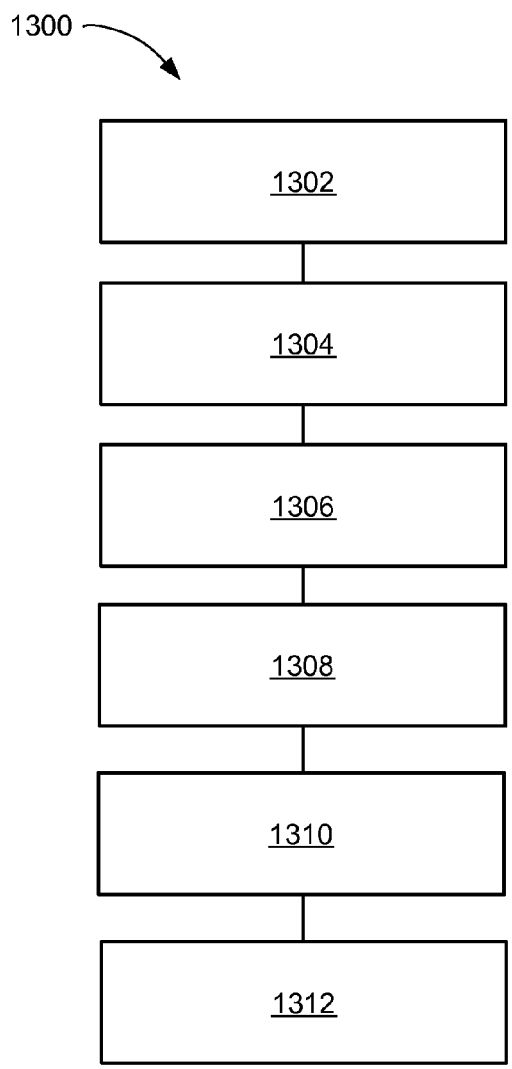
FIG. 13 is a flow chart of a method of manufacture of an integrated circuit packaging system in an embodiment of the present invention.

Referring now to FIG. 13, therein is shown a flow chart of a method 1300 of manufacture of an integrated circuit packaging system in an embodiment of the present invention. The method 1300 includes providing a base substrate having a component side in a block 1302; mounting a device over the component side in a block 1304; forming a shield connector on the component side adjacent the device in a block 1306; forming a package interconnect on the component side outside a region having the shield connector and the device in a block 1308; applying an encapsulant around the package interconnect, the shield connector, and the device in a block 1310; and mounting a shield structure on the encapsulant, the shield connector, and the device, with the package interconnect partially exposed in a block 1312.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base substrate having a component side;
   mounting a device over the component side;
   forming a shield connector on the component side adjacent the device;
   forming a package interconnect on the component side outside a region having the shield connector and the device;
   applying an encapsulant around the package interconnect, the shield connector, and the device; and
   mounting a shield structure on the encapsulant, the shield connector, and the device, with the package interconnect partially exposed.

2. The method as claimed in claim 1 wherein applying the encapsulant includes forming a depression in the encapsulant over the device and the shield connector.

3. The method as claimed in claim 1 wherein mounting the shield structure includes inserting an interlock coupler of the shield structure in the shield connector.

4. The method as claimed in claim 1 further comprising mounting an adjacent device having an offset from the device and over the component side.

5. The method as claimed in claim 1 further comprising forming an integrated circuit component integrated with the shield structure, the shield structure of the integrated circuit component connected to the device.

6. A method of manufacture of an integrated circuit packaging system comprising:
   providing a base substrate having a component side and a system connector opposite the component side;
   mounting a device over the component side;
   forming a shield connector on the component side adjacent the device;
   forming a package interconnect on the component side outside a region having the shield connector and the device;
   applying an encapsulant around the package interconnect, the shield connector, and the device; and
   mounting a shield structure on the encapsulant, the shield connector, and the device, with the package interconnect partially exposed.

7. The method as claimed in claim 6 further comprising:
   providing a stack package having a package substrate with an opening; and
   attaching a thermal layer to the stack package and the shield structure partially in the opening.

8. The method as claimed in claim 6 wherein mounting the shield structure includes inserting the shield structure in an interlock structure of the shield connector.

9. The method as claimed in claim 6 wherein mounting the shield structure includes mounting an integrated circuit component having the shield structure over the shield connector.

10. The method as claimed in claim 6 further comprising:
    mounting an electrically conductive layer on the device; and
    mounting an integrated circuit component having the shield structure on the electrically conductive layer.

11. An integrated circuit packaging system comprising:
    a base substrate having a component side;
    a device mounted over the component side;
    a shield connector formed on the component side adjacent the device;
    a package interconnect on the component side outside a region having the shield connector and the device;
    an encapsulant around the package interconnect, the shield connector, and the device; and
    a shield structure on the encapsulant, the shield connector, and the device, with the package interconnect partially exposed.

12. The system as claimed in claim 11 wherein the encapsulant includes a depression formed in the encapsulant over the device and the shield connector.

13. The system as claimed in claim 11 wherein the shield structure includes an interlock coupler of the shield structure inserted in the shield connector.

14. The system as claimed in claim 11 further comprising an adjacent device having an offset from the device and mounted over the component side.

15. The system as claimed in claim 11 further comprising an integrated circuit component integrated with the shield structure, the shield structure of the integrated circuit component connected on to the device.

16. The system as claimed in claim 11 wherein:
the base substrate includes the base substrate having a system connector opposite the component side.

17. The system as claimed in claim 16 further comprising:
a stack package having a package substrate formed with an opening; and
a thermal layer attached to the stack package and the shield structure partially in the opening.

18. The system as claimed in claim 16 wherein the shield connector includes the shield structure inserted in an interlock structure of the shield connector.

19. The system as claimed in claim 16 further comprising an integrated circuit component having the shield structure mounted over the shield connector.

20. The system as claimed in claim 16 further comprising;
an electrically conductive layer mounted on the device; and
an integrated circuit component having the shield structure mounted on the electrically conductive layer.

* * * * *